(12) United States Patent
Robert et al.

(10) Patent No.: US 11,071,233 B1
(45) Date of Patent: Jul. 20, 2021

(54) AUXILIARY-COOLED ELECTRONICS ASSEMBLY WITH EXTRUDED COOLING CAVITY

(71) Applicant: BorgWarner, Inc., Auburn Hills, MI (US)

(72) Inventors: Dominique Robert, Montegrosso d'Asti (IT); Glen Kozeli, Macomb, MI (US); Philippe Alain Clayton, Camparada (IT)

(73) Assignee: BORGWARNER, INC., Auburn Hills, MI (US)

( * ) Notice: Subject to any disclaimer, the term of this patent is extended or adjusted under 35 U.S.C. 154(b) by 0 days.

(21) Appl. No.: 16/813,907

(22) Filed: Mar. 10, 2020

(51) Int. Cl.
*H05K 7/20* (2006.01)
*H05K 9/00* (2006.01)

(52) U.S. Cl.
CPC ..... *H05K 7/20281* (2013.01); *H05K 7/20927* (2013.01); *H05K 9/0049* (2013.01)

(58) Field of Classification Search
None
See application file for complete search history.

(56) References Cited

U.S. PATENT DOCUMENTS

| | | | |
|---|---|---|---|
| 4,420,739 A | 12/1983 | Herren | |
| 8,213,179 B2 * | 7/2012 | Yoshida | H05K 7/20927 361/699 |
| 9,544,988 B2 * | 1/2017 | Suzuki | F28D 15/0266 |
| 10,475,724 B2 * | 11/2019 | Maehler | H01L 21/4882 |
| 10,767,605 B2 * | 9/2020 | Yamada | F28D 7/16 |
| 10,770,373 B2 * | 9/2020 | Tamura | H05K 7/20927 |
| 10,822,096 B2 * | 11/2020 | Yang | H05K 7/20254 |
| 10,905,031 B1 * | 1/2021 | Gao | H05K 7/20781 |
| 2005/0133210 A1 | 6/2005 | Inagaki et al. | |
| 2007/0044952 A1 | 3/2007 | Kuno et al. | |
| 2010/0175857 A1 * | 7/2010 | Gerstler | F28D 15/00 165/104.31 |
| 2012/0044647 A1 * | 2/2012 | Lee | H01G 4/38 361/702 |
| 2015/0009624 A1 | 1/2015 | Dunwoody et al. | |
| 2016/0311311 A1 * | 10/2016 | Choi | F25B 6/04 |
| 2019/0049195 A1 | 2/2019 | Meshenky | |
| 2019/0115637 A1 | 4/2019 | Kim et al. | |
| 2019/0126773 A1 | 5/2019 | Chung et al. | |

\* cited by examiner

*Primary Examiner* — Courtney L Smith
(74) *Attorney, Agent, or Firm* — Reising Ethington P.C.

(57) ABSTRACT

An auxiliary-cooled electronics assembly comprises a metal extrusion that includes: one or more cooling conduits extending axially along a length of the metal extrusion with a first open end in fluid communication with the cooling conduit(s); and a second open end in fluid communication with the cooling conduit(s); a first end cap coupled to the first open end forming a fluid-tight seal between the first end cap and the metal extrusion; a second end cap coupled to the second open end forming a fluid-tight seal between the second end cap and the metal extrusion; and one or more electrical circuit components, electrically linked together to form an electrical circuit, mounted to the metal extrusion.

18 Claims, 14 Drawing Sheets

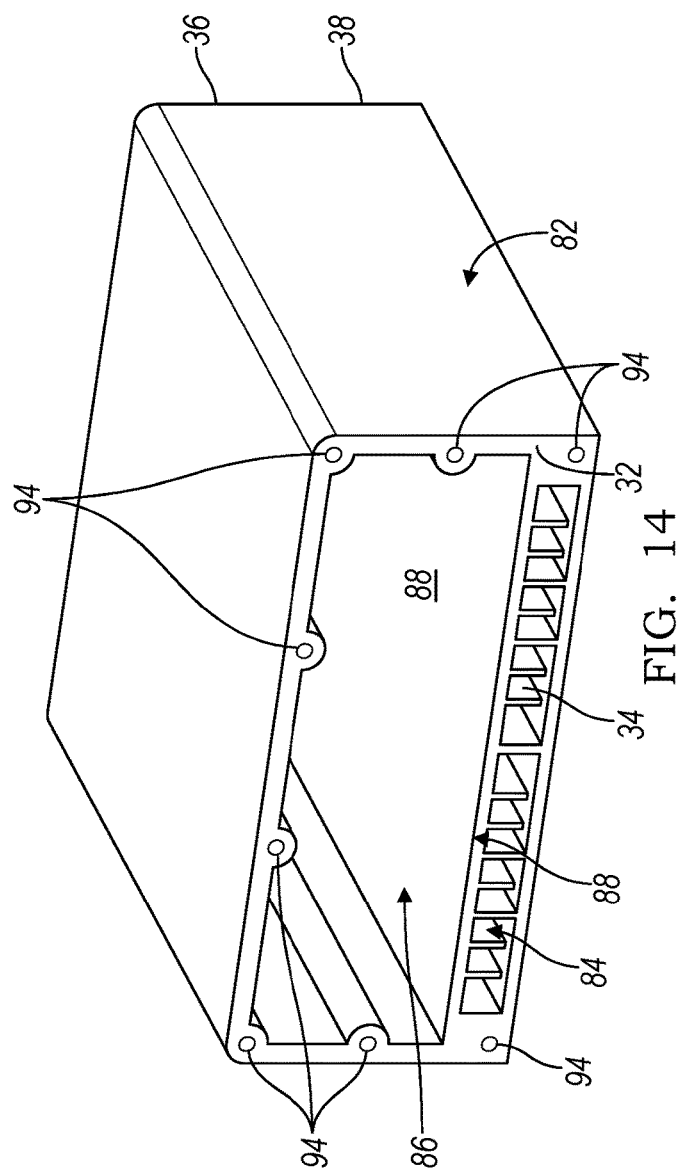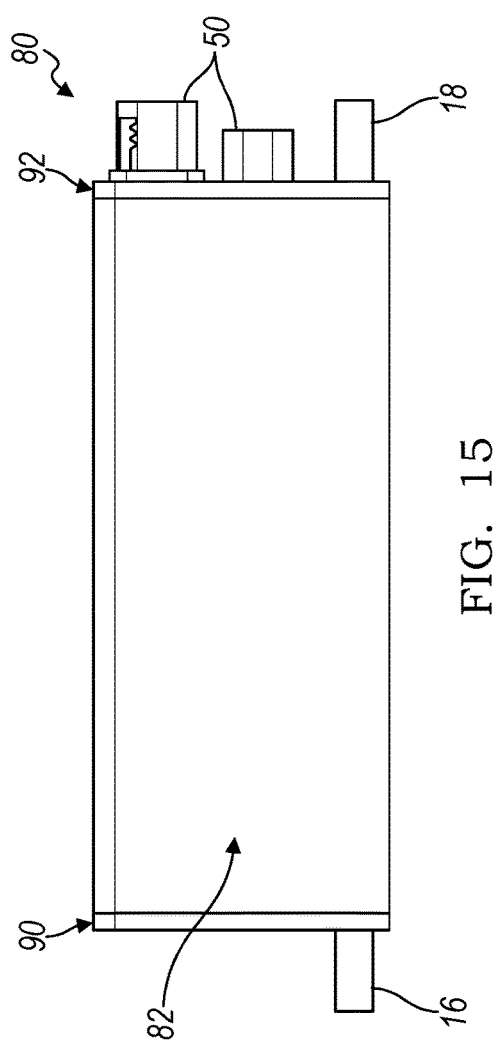

US 11,071,233 B1

AUXILIARY-COOLED ELECTRONICS ASSEMBLY WITH EXTRUDED COOLING CAVITY

TECHNICAL FIELD

The present application relates to an assembly that houses a plurality of electrical circuit components and, more particularly, to a metal extrusion having a cooling cavity that can receive and communicate cooling fluid.

BACKGROUND

Electrical circuits can be implemented using a variety of different electrical components the selection of which can be chosen depending on the electrical system that is controlled. For example, an electrical system with an electric motor can use electrical components, such as one or more power switches, that selectively flow electrical current to the motor windings of the motor. As the power switches control the flow of electrical current to the electrical motor, heat is generated by the switches. However, heat is often undesirable to the performance of electrical components and electrical circuits. Reducing the temperature of electrical components can increase the performance of an electrical circuit.

Electrical components of electrical circuits can be cooled in a variety of ways. Sometimes, air can be forced over the surface of the electrical components to dissipate the heat given off and carry it away from the electrical circuit. However, flowing ambient air is a relatively inefficient medium for carrying heat away from the electrical components. In contrast, cooled fluid placed in close proximity to the electrical components can be used to more efficiently remove heat. But electrical components are often incompatible with fluid and cannot contact the fluid as the components could with ambient air. It would be helpful to cool electrical components with an assembly that efficiently flows cooling fluid yet maintains a leak-resistant separation between the fluid and the electrical components.

SUMMARY

In one implementation, an auxiliary-cooled electronics assembly comprises a metal extrusion that includes: one or more cooling conduits extending axially along a length of the metal extrusion with a first open end in fluid communication with the cooling conduit(s); and a second open end in fluid communication with the cooling conduit(s); a first end cap coupled to the first open end forming a fluid-tight seal between the first end cap and the metal extrusion; a second end cap coupled to the second open end forming a fluid-tight seal between the second end cap and the metal extrusion; and one or more electrical circuit components, electrically linked together to form an electrical circuit, mounted to the metal extrusion.

In another implementation, an auxiliary-cooled electronics assembly comprises a metal extrusion that includes one or more cooling conduits extending axially along a length of the metal extrusion with a first open end in fluid communication with the cooling conduit(s) and a second open end in fluid communication with the cooling conduit(s); a cover conduit, extending axially along the length of the metal extrusion, separated from the cooling conduit(s) by a mounting base extending in between the cover conduit and the cooling conduit(s); a first end cap coupled to a first end of the metal extrusion forming a fluid-tight seal between the first end cap and the first open end; a second end cap coupled to a second end of the metal extrusion forming a fluid-tight seal between the second end cap and the second open end; and one or more electrical circuit components, electrically linked together to form an electrical circuit, mounted to the metal extrusion.

BRIEF DESCRIPTION OF THE DRAWINGS

FIG. 14 is a cross-sectional view depicting another implementation of a portion of an auxiliary-cooled electronics assembly; and FIG. 15 is a perspective view depicting another implementation of a portion of an auxiliary-cooled electronics assembly.

DETAILED DESCRIPTION

An auxiliary-cooled electronics assembly can carry electrical circuit components and cool those components using one or more cooling conduits in the metal extrusion that flow cooling fluid. End caps can be attached to the assembly or the metal extrusion forming a fluid-tight seal enclosing the cooling conduit(s); the caps can include a fluid inlet and/or a fluid outlet for the cooling fluid to enter and exit the cooling conduit(s) and carry heat away from the electrical circuit components. The electrical circuit components can be attached to the metal extrusion and protected by a cover that extends over the electrical components and encloses them under or within. Cooling fluid, such as internal combustion engine (ICE) coolant or lubricant, can be provided to the fluid inlet. The fluid can pass through the cooling conduit and exit the fluid outlet.

Figure 1:
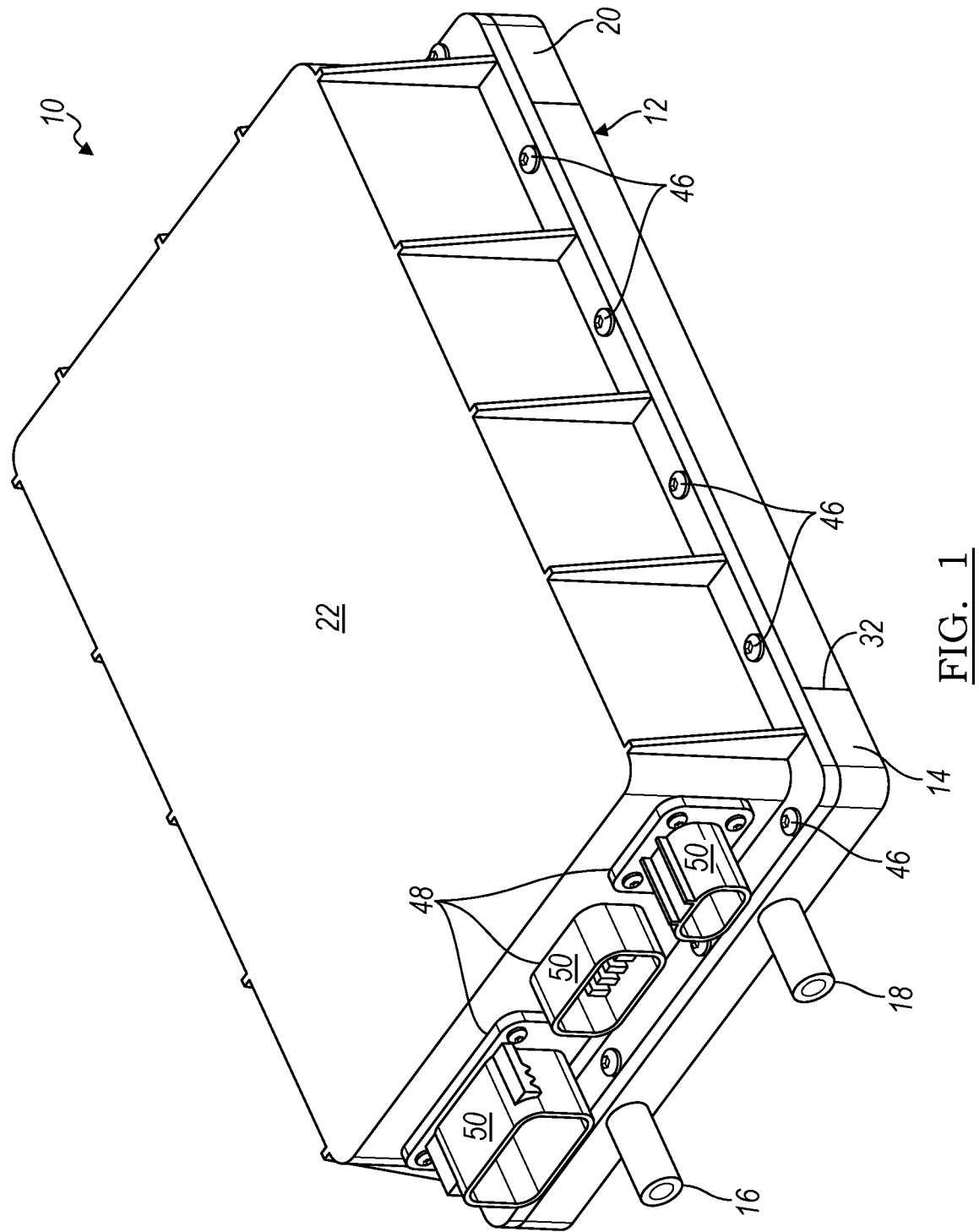
FIG. 1 is a perspective view depicting an implementation of an auxiliary-cooled electronics assembly.
Figure 2:
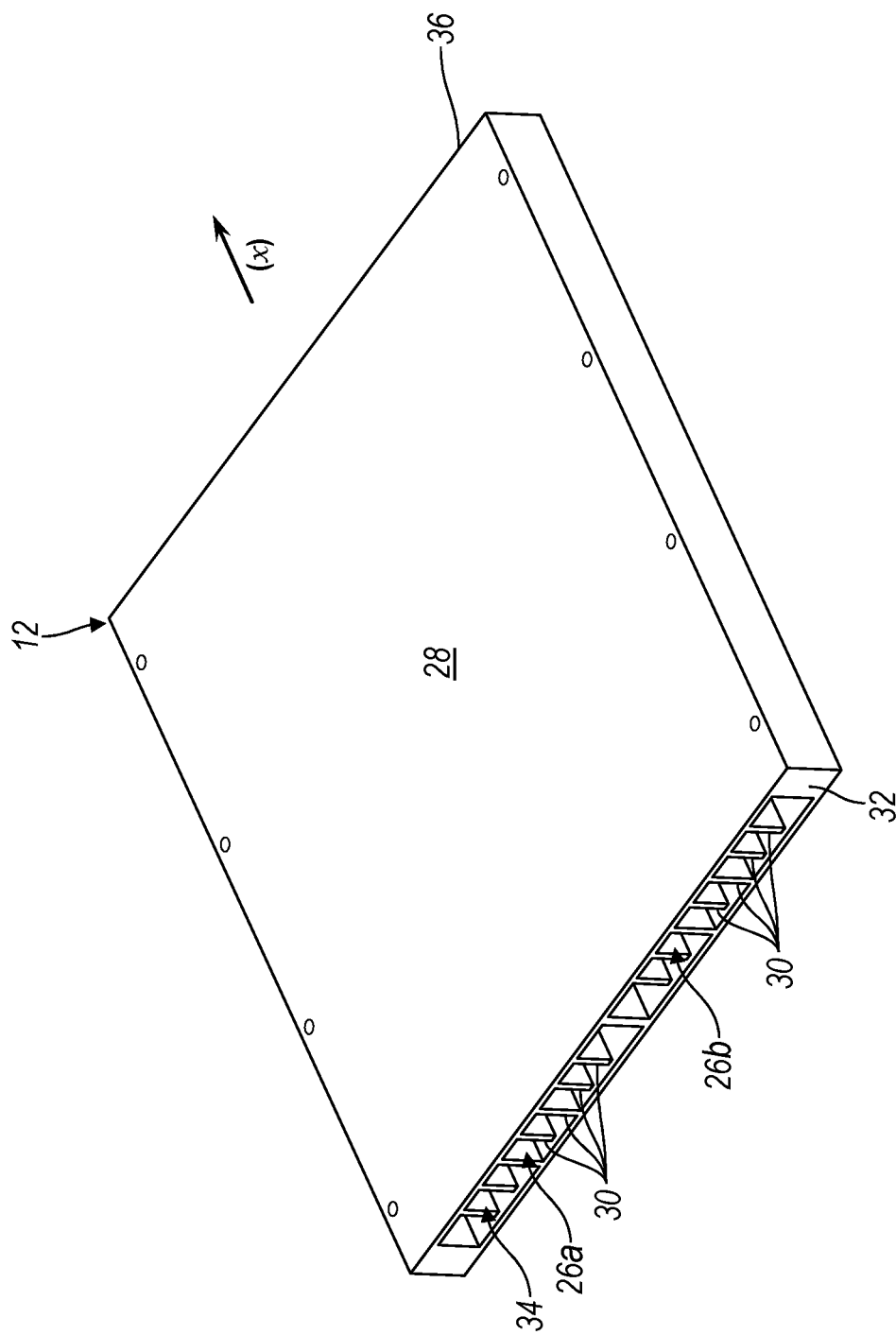
FIG. 2 is a perspective view depicting an implementation of a portion of an auxiliary-cooled electronics assembly.

Turning to FIGS. 1-4, an implementation of an auxiliary-cooled electronics assembly 10 is shown. FIG. 1 depicts the assembly 10 including a metal extrusion 12, a first end cap 14 having a fluid inlet 16 and a fluid outlet 18, a second end cap 20, and a cover 22. A plurality of electrical circuit components 24, shown in FIG. 4, can be mounted on the metal extrusion 12, either directly so that a surface of the components 24 abuts and contacts the metal extrusion 12, or so that the components 24 are in close proximity to the metal extrusion 12. The metal extrusion 12 can include one or more cooling conduits 26 that extend axially within the metal extrusion 12 and can communicate cooling fluid within the extrusion 12. FIG. 2 depicts an implementation of the metal extrusion 12, included with the assembly, without end caps 14, 20. The overall structure of the metal extrusion 12 and the cooling conduits 26 can be formed by extruding metal through a die so that the cooling conduits(s) 26 are formed along the length of the metal extrusion 12 along with the structure of the metal extrusion 12. The shape of the die can define the cross-sectional shape of the metal extrusion 12, including a mounting base 28 that receives the electrical circuit components 24, and the cooling conduit(s) 26. The metal extrusion 12 can have a cross-section defined by the die and a length that can be set while the metal extrusion 12 is created. In some implementations, cooling fins 30 can be formed in the metal extrusion 12 that extend into the cooling conduit(s) 26 and along the length of the metal extrusion 12. The cooling fins 30 can have a cross-section that is defined by the die through which the metal is extruded. The cooling fins 30 can increase the surface area of the cooling conduit(s) 26, and thereby the metal extrusion 12, exposed to the cooling fluid.

Generally speaking, the metal extrusion 12 can be formed when a blank of metal, such as aluminum, is forced through the die, having a smaller cross-sectional size relative to the blank, under pressure to create the metal extrusion 12. In one implementation, the metal extrusion 12 can be formed from aluminum. The cross-sectional shape of the metal extrusion 12 can be uniform along its axial length. And the length of the metal extrusion 12 can be defined by cutting the extrusion perpendicular to an axis (x) of extrusion. A number of different extrusion techniques can be used to create the metal extrusion 12. For example, hot extrusion and cold extrusion can be used to form the metal extrusion 12, and the metal blank can be directly or indirectly forced through the die. And it should be appreciated that metal materials other than aluminum could be used to form the metal extrusion 12.

Figure 3:
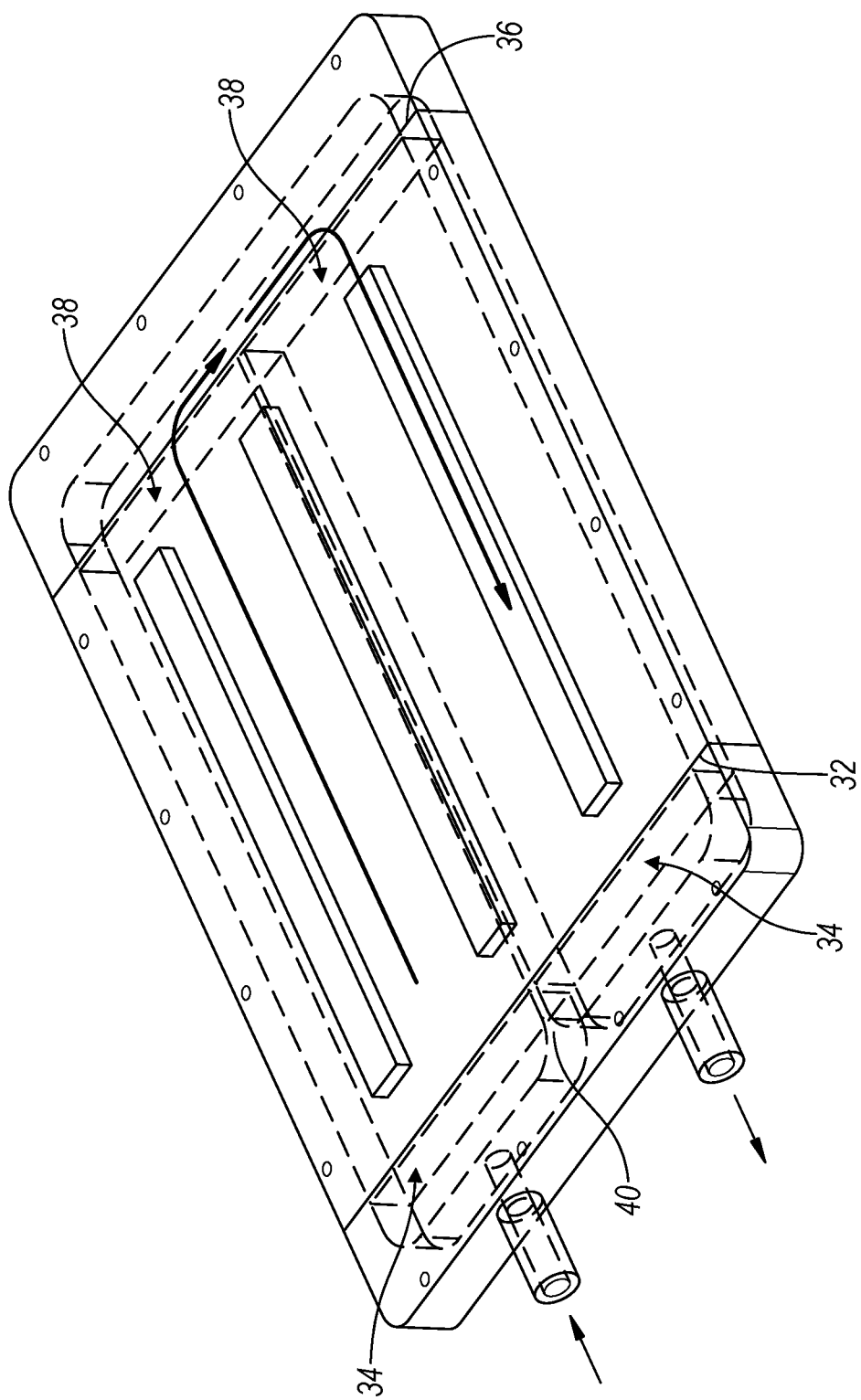
FIG. 3 is another perspective view depicting an implementation of a portion of an auxiliary-cooled electronics assembly.
Figure 4:
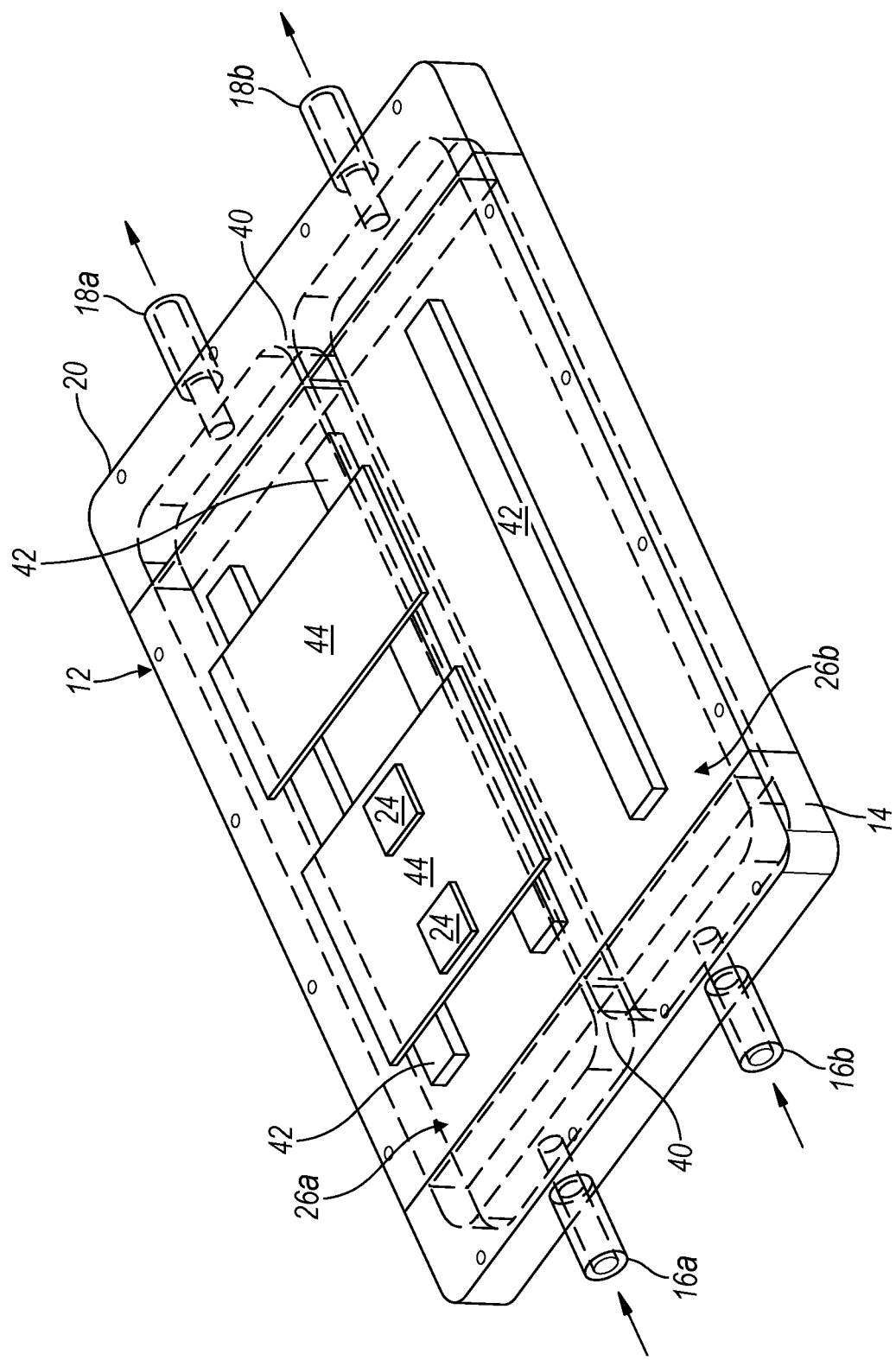
FIG. 4 is a perspective view depicting another implementation of a portion of an auxiliary-cooled electronics assembly.

The first end cap 14 and the second end cap 20 can be attached to the metal extrusion 12 in a fluid-tight manner to enclose and partially define the cooling conduit(s) 26. The first end cap 14 can be attached to a first end 32 of the metal extrusion 12 so as to close off a first open end 34 and define at least a portion of the fluid conduit(s) 26. The second end cap 20 can be attached to a second end 36 of the metal extrusion 12 so as to close off a second open end 38 and define at least a portion of the fluid conduit(s) 26. In some implementations a gasket can be used between the first end cap 14 and the first end 32 and/or the second end cap 20 and the second open end 38. The first end cap 14 and the second end cap 20 could be attached to the metal extrusion 12 in a variety of ways, such as by welding, brazing, or via mechanical fasteners that draw the end caps 14, 20 toward the metal extrusion 20. In this implementation, the metal extrusion 12 includes two cooling conduits 26. And the first end cap 14 includes a conduit divider 40 that separates a first fluid conduit 26a from a second fluid conduit 26b. The first end cap 14 can include the fluid inlet 16 that is in fluid communication with the first fluid conduit 26a and a fluid outlet 18 that is in fluid communication with the second fluid conduit 26b. The fluid inlet 16 can be separated from the fluid outlet 18 by the conduit divider 40 as is shown in FIG. 3. In another embodiment, shown in FIG. 4, the first end cap 14 can include a first fluid inlet 16a separated from a second fluid inlet 16b by a conduit divider 40 and the second end cap 20 can include a first fluid outlet 18a separated from a second fluid outlet 18b by a conduit divider 40. The first fluid inlet 16a receives and communicates cooling fluid through the first cooling conduit 26a to the first fluid outlet 18a and the second fluid inlet 16b receives and communicates cooling fluid to the second fluid outlet 18b. The width and height of the first end cap 14 and second end cap 20 can closely conform or match with the width and height of the metal extrusion 12.

One or more electrical circuit components 24 can be attached to the metal extrusion 12. An outer surface of the metal extrusion 12 can include a mounting base 28 on which the electrical circuit components 24 can attach to the assembly 10. The mounting base 28 can be a portion of the metal extrusion 12 that, on one side, receives the electrical circuit components 24, and on another opposite side of the base 28, a cooling conduit 26 exists that carries cooling fluid. Electrical circuit components 24 include switches, resistors, inductors, and capacitors that may be carried by printed circuit board assemblies (PCBAs) and electrically connected together to form electrical circuits. The electrical circuit components 24 can be attached to the mounting base 28 via rails 42 that provide some separation between the electrical circuit components 24 and the mounting base 28 so that they are in close proximity to the mounting base 28, but do not directly contact the mounting base 28. In one implementation, a plurality of electrical circuit components 24, such as power switches implemented as MOSFETs along with resistors, capacitors, and/or inductors, can be physically and electrically linked to a PCBA 44, and the PCBA 44 can be physically attached to the rails 42. In another implementation, the electrical circuit components 24 can be directly attached to the mounting base 28 of the metal extrusion 12, such that a surface of the electrical circuit components 24 directly abuts the mounting base 28 of the metal extrusion 12, without separation as would occur with the use of rails 42. In one implementation, the PCBA 44 carrying a plurality of electrical circuit components 24 as described above, such as power switches and others, can be directly mounted so that a substrate of PCBA 44 abuts the mounting base 28. In this implementation, the PCBA substrate can be made of metal rather than a composite, such as FR4, to better conduct heat from the components 24, such as power switches, into the metal extrusion 12 so that cooling fluid passing through the fluid conduits 26 can more efficiently carry the heat away. And in yet another implementation, the PCBA 44 can be mounted so that electrical circuit components 24, such as the power switches, can be mounted in between a PCB substrate and the mounting base 28 of the metal substrate 12, so that at least some of the electrical circuit components 24 can directly abut the mounting base 28 and contact an outer surface of the metal substrate 12.

In one implementation, the cover 22 can attach to the metal extrusion 12, the first end cap 14, and/or the second end cap 20. The cover 22 can be a separate element that encapsulates the electrical circuit components 24 and protects them from external harms, such as heat, dust, or moisture, to name a few. In this implementation, the cover 22 is a discrete element that can be affixed to the auxiliary-cooled electronics assembly 10 as shown in FIG. 1. The cover 22 can be stamped from sheet metal or cast out of metal and include physical attachment points 46 where the cover 22 can be affixed to the assembly 10. The cover 22 can be attached using mechanical fasteners, such as screws/nuts or rivets, or pivotable clamps that releasably attach to the metal extrusion 12, and have levers that engage the cover 22 and compress it against the metal extrusion 12. In some implementations, the cover 22 can be molded from a composite or plastic. The plastic or composite can be made of an electromagnetic field (EMF) shielding material. For example, an EMF fabric can be molded into a composite material forming the cover 22. The EMF shielding material can form a Faraday Cage around the electrical circuit components 24. Further, the cover 22 can include one or more openings 48 that can accommodate electrical inputs or outputs, such as a power supply or an electrical control signal output, in the form of a male or female electrical connector 50 that can receive a corresponding male or female plug.

Figure 5:
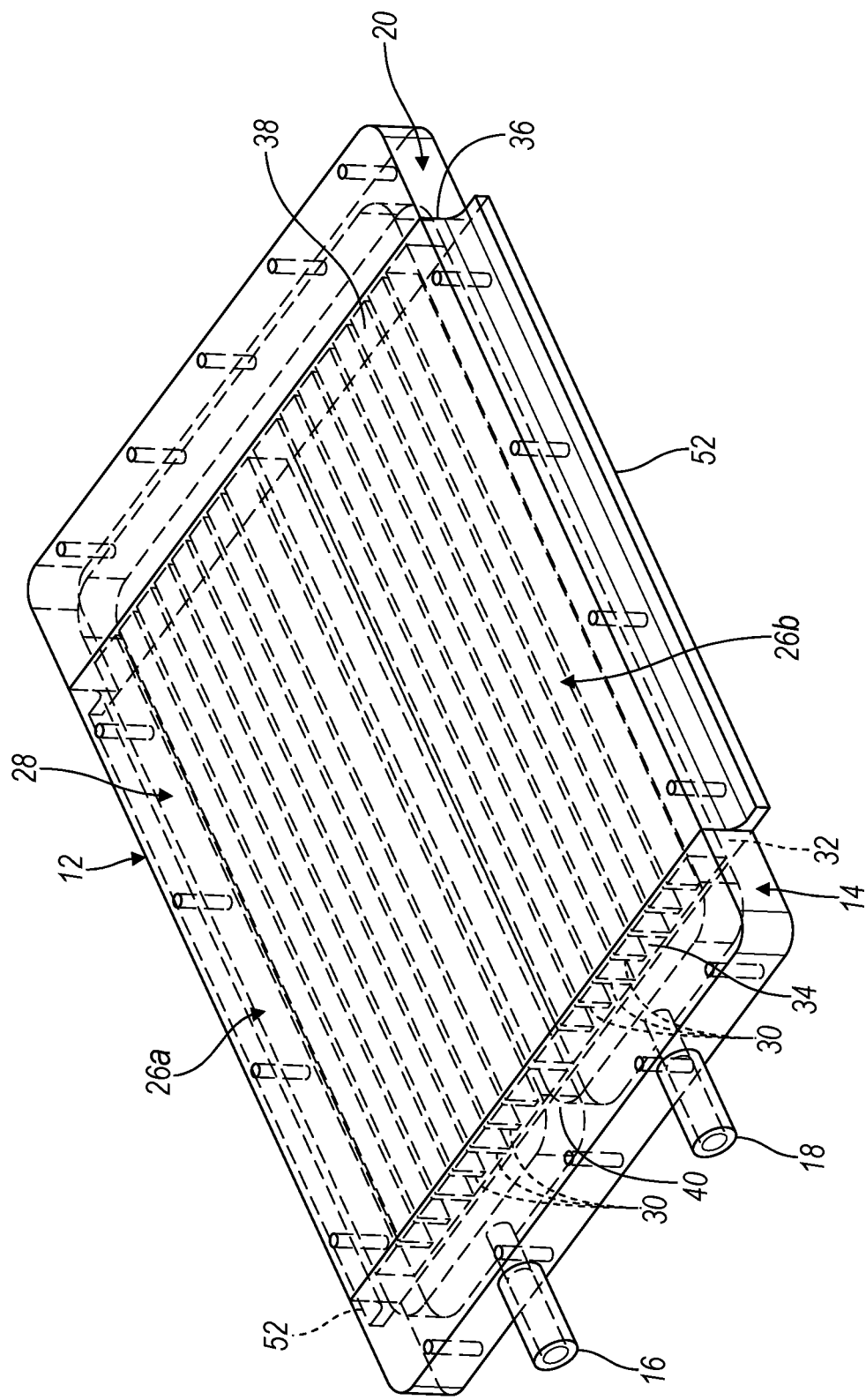
FIG. 5 is a perspective view depicting another implementation of a portion of an auxiliary-cooled electronics assembly.
Figure 6:
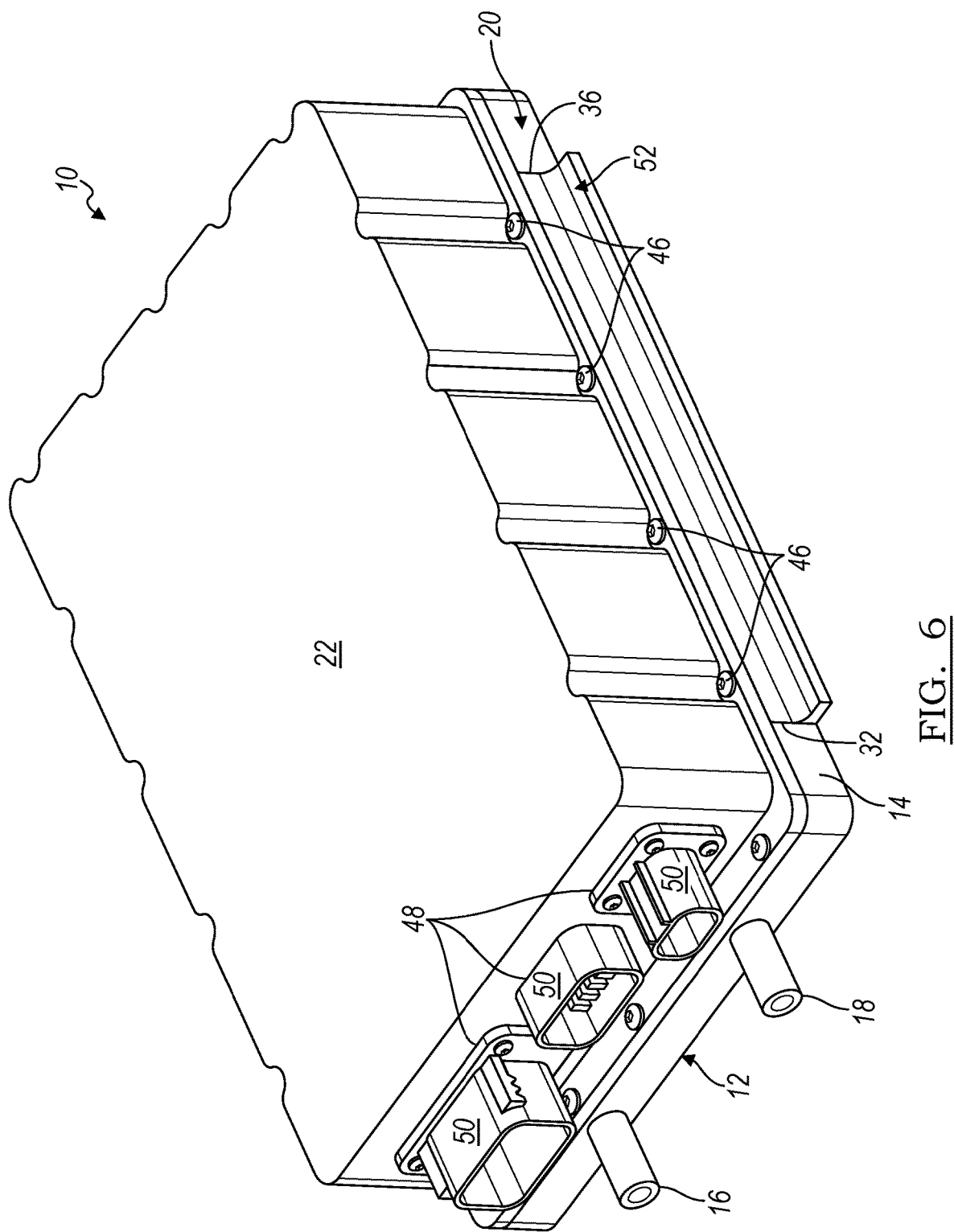
FIG. 6 is a perspective view depicting another implementation of an auxiliary-cooled electronics assembly.
Figure 7:
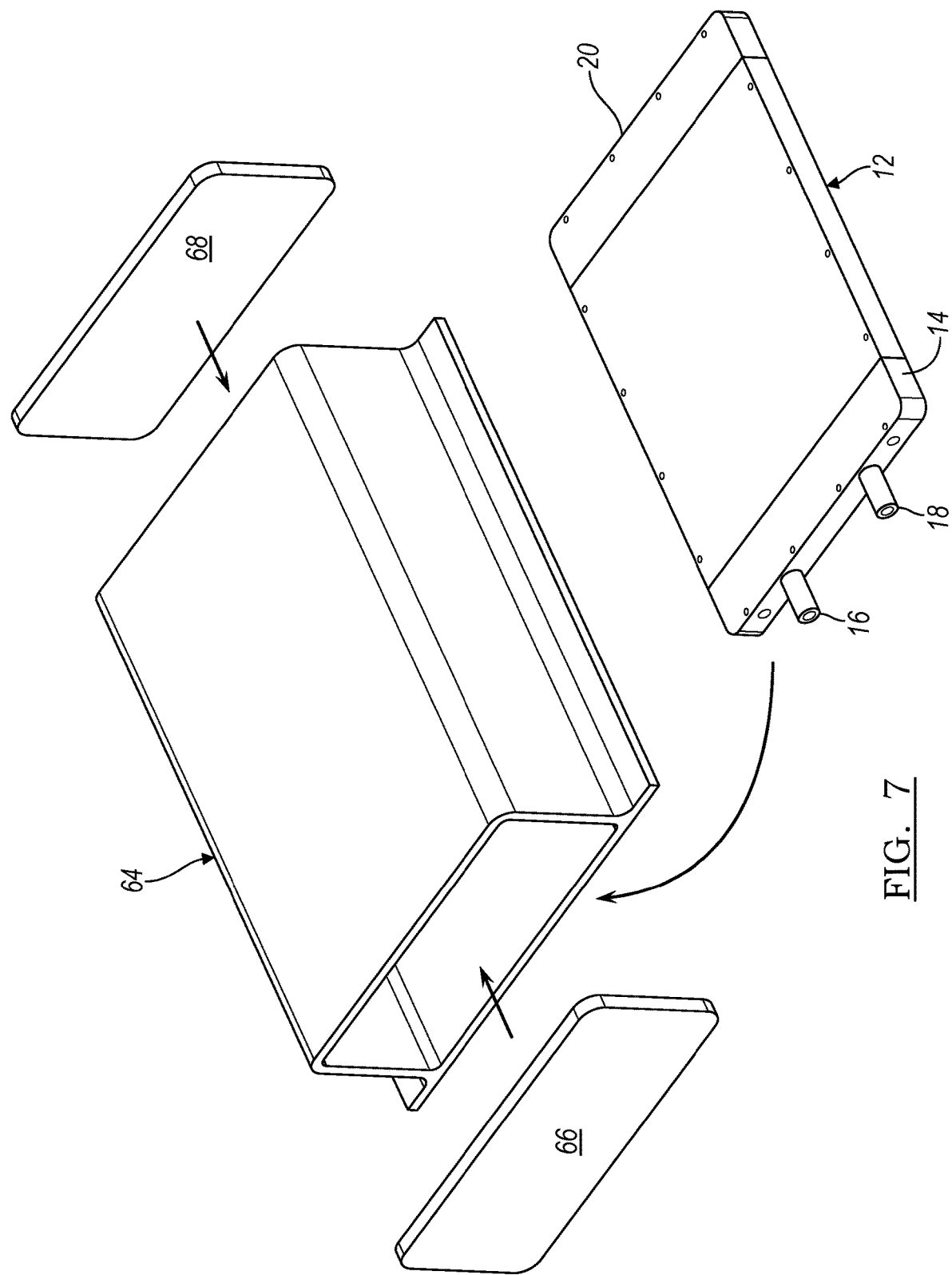
FIG. 7 is an exploded view depicting another implementation of an auxiliary-cooled electronics assembly.

Another embodiment of the metal extrusion 12' is shown in FIGS. 5-6. The metal extrusion 12 includes one or more mounting flanges 52 that can be formed integrally with the extrusion 12. As the metal passes through the die, the mounting flanges 52 can be formed, thereby creating flanges 52 that extend away from the cooling channels 26. Holes can later be drilled into the mounting flanges 52 and mechanical fasteners can pass through the holes and engage a structure on which the assembly 10 can be mounted.

The auxiliary-cooled electronics assembly 10 can receive cooling fluid that flows through the cooling conduit(s) 26 thereby dissipating heat emitted by the electrical components 24. Cooling fluid, such as ICE coolant or ICE oil, can be received at the fluid inlet 16 and pushed under pressure through the cooling conduit(s) 26 to cool the metal extrusion 12 and also the electrical circuit components 24 ultimately exiting the fluid outlet 18 where the cooling fluid can be cooled using a radiator or other heat-exchange mechanism, and then ultimately returned to the fluid inlet 16.

Another implementation of an auxiliary cooled electronics assembly 60 is shown in FIGS. 7-12. The assembly 60 includes a metal extrusion 12, similar to what is described above with respect to FIGS. 1-6, and a metal cover extrusion 64 having a hollow cross-section that couples to the extrusion 12. In this implementation, the metal extrusion 12 can attach to the metal cover extrusion 64 and a first metal cover extrusion cap 66 and a second metal cover extrusion cap 68 can be attached to ends of the metal cover extrusion 64. The metal extrusion 12 includes a first end cap 14 having a fluid inlet 16 and a fluid outlet 18, and a second end cap 20. A plurality of electrical circuit components 24 can be mounted on the metal extrusion 12, either directly so that a surface of the components 24 abuts and contacts the metal extrusion 12, or so that the components 24 are in close proximity to the metal extrusion 12. The metal extrusion 12 can include one or more cooling conduits 26 that extend axially within the metal extrusion 12 and can communicate cooling fluid within the extrusion 12. In another implementation, shown in FIGS. 8-12, a metal extrusion 62 can include mounting flanges 52 that are ultimately received by receiving grooves 54 formed in the metal cover extrusion 64'. In this implementation, the metal cover extrusion 64' can be extruded through a die that is shaped to form the receiving grooves 54. The metal extrusion 62 can be slid into the hollow cross-section of the metal cover extrusion 64 such that the mounting flanges 52 are shaped to correspond to the receiving grooves 54, which can support the metal extrusion 12 within the metal cover extrusion 64. Two or more rails 42 can extend radially, outwardly from and along an exterior surface of the metal extrusion 62.

Figure 8:
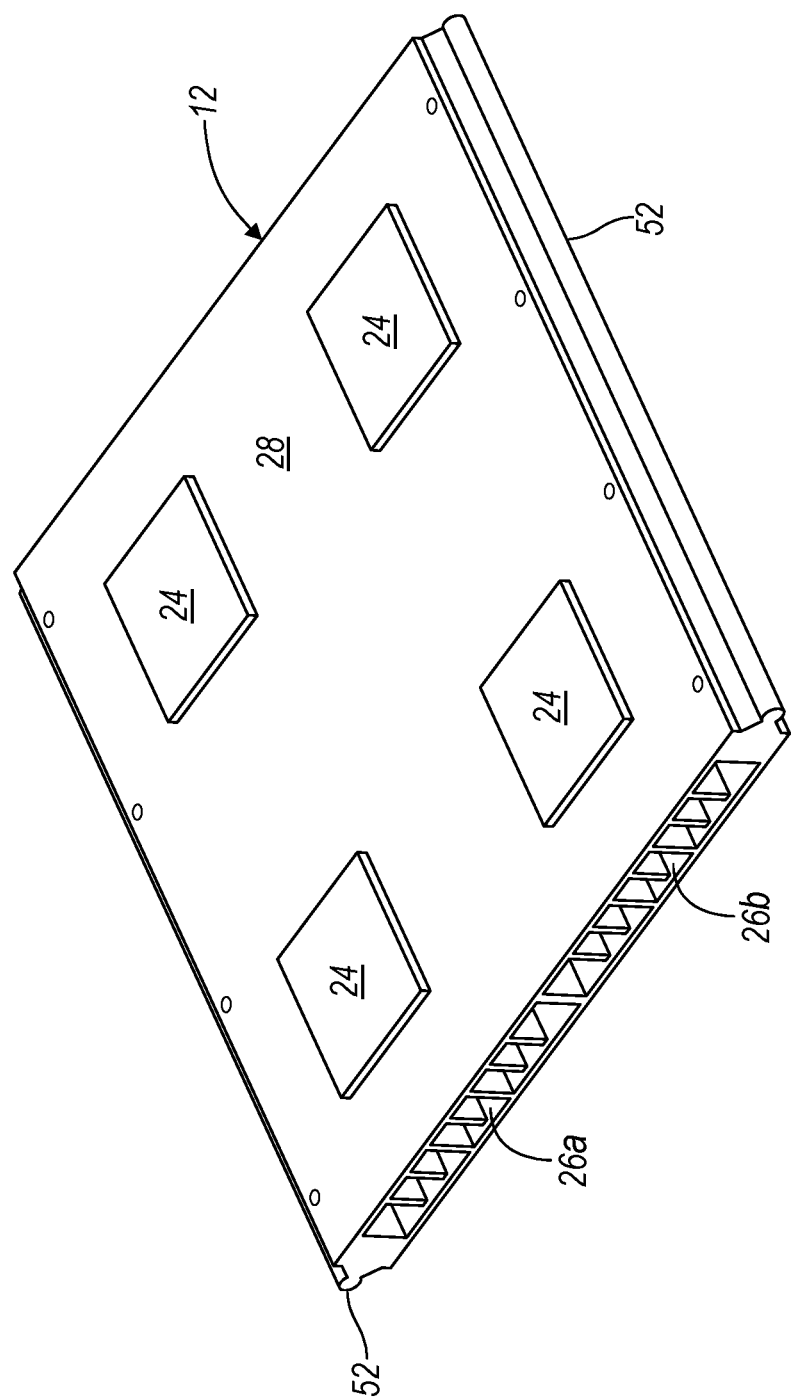
FIG. 8 is a perspective view depicting another implementation of a portion of an auxiliary-cooled electronics assembly.
Figure 9:
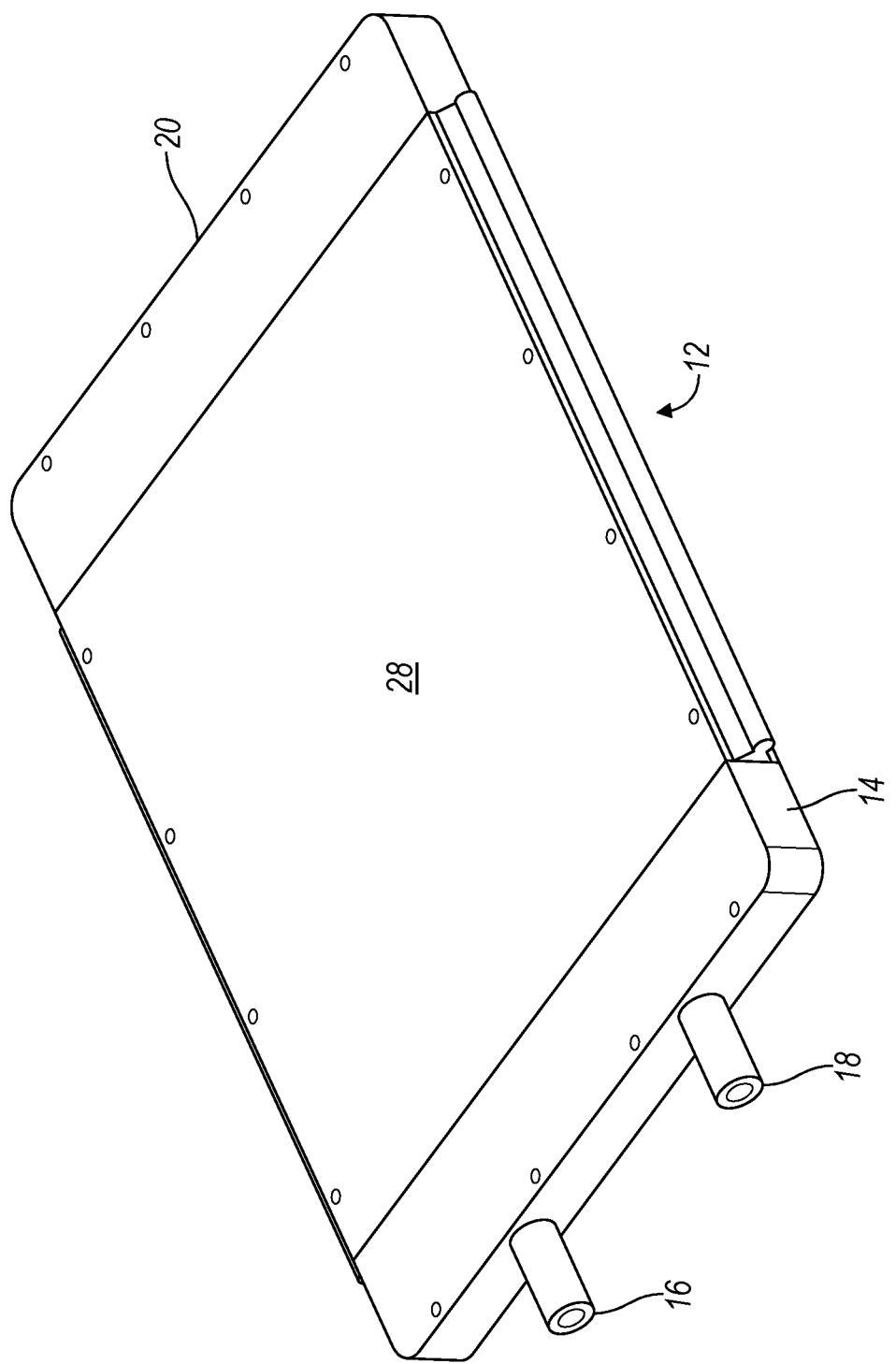
FIG. 9 is a perspective view depicting another implementation of a portion of an auxiliary-cooled electronics assembly.
Figure 10:
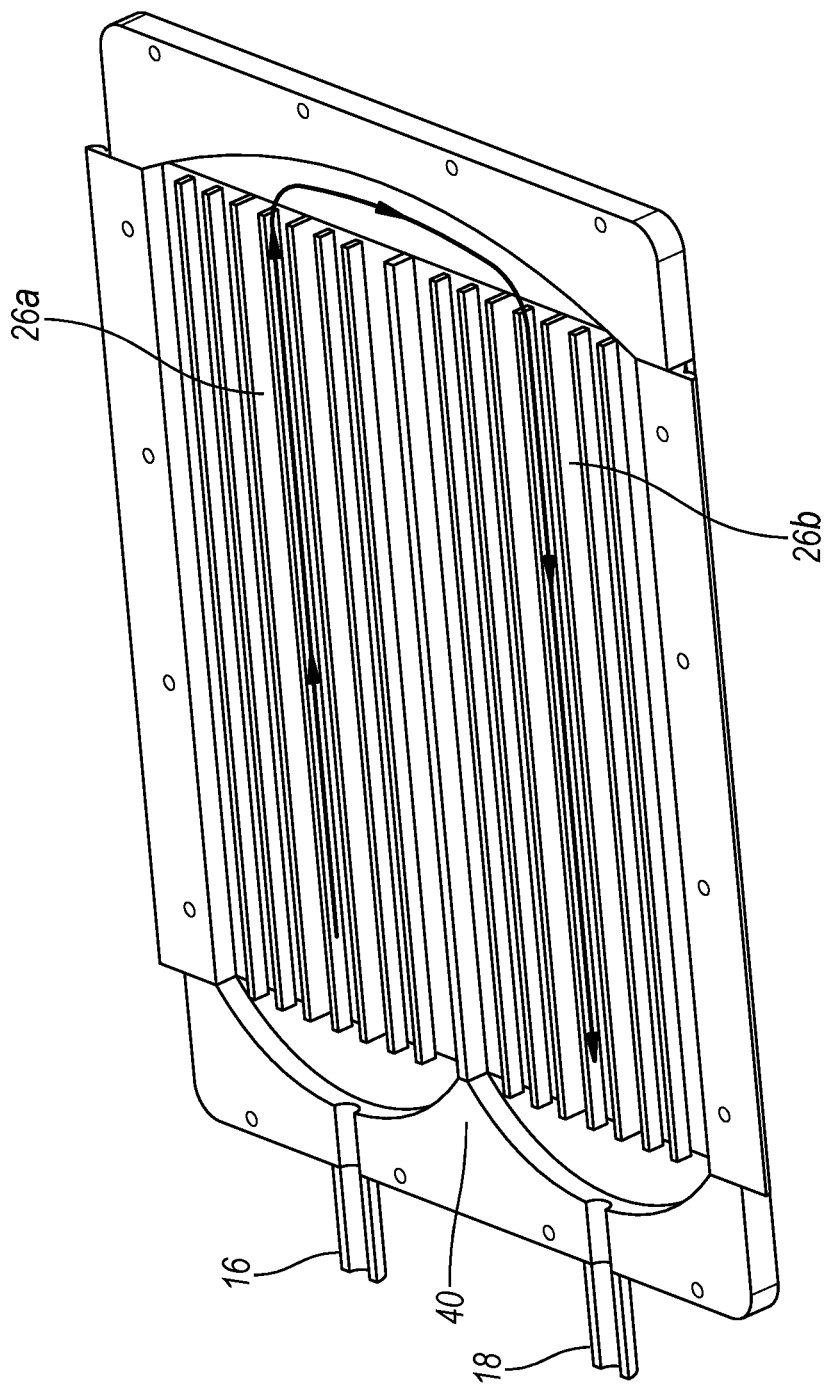
FIG. 10 is a cross-sectional view depicting another implementation of a portion of an auxiliary-cooled electronics assembly.
Figure 11:
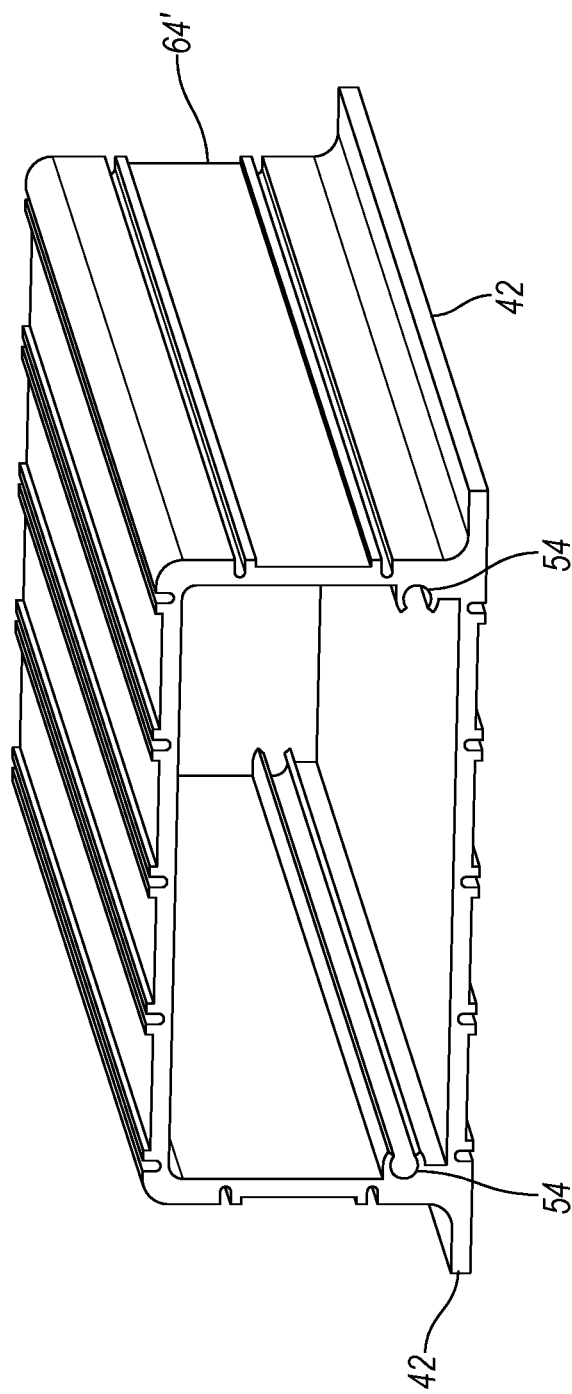
FIG. 11 is a perspective view depicting another implementation of a portion of an auxiliary-cooled electronics assembly.
Figure 12:
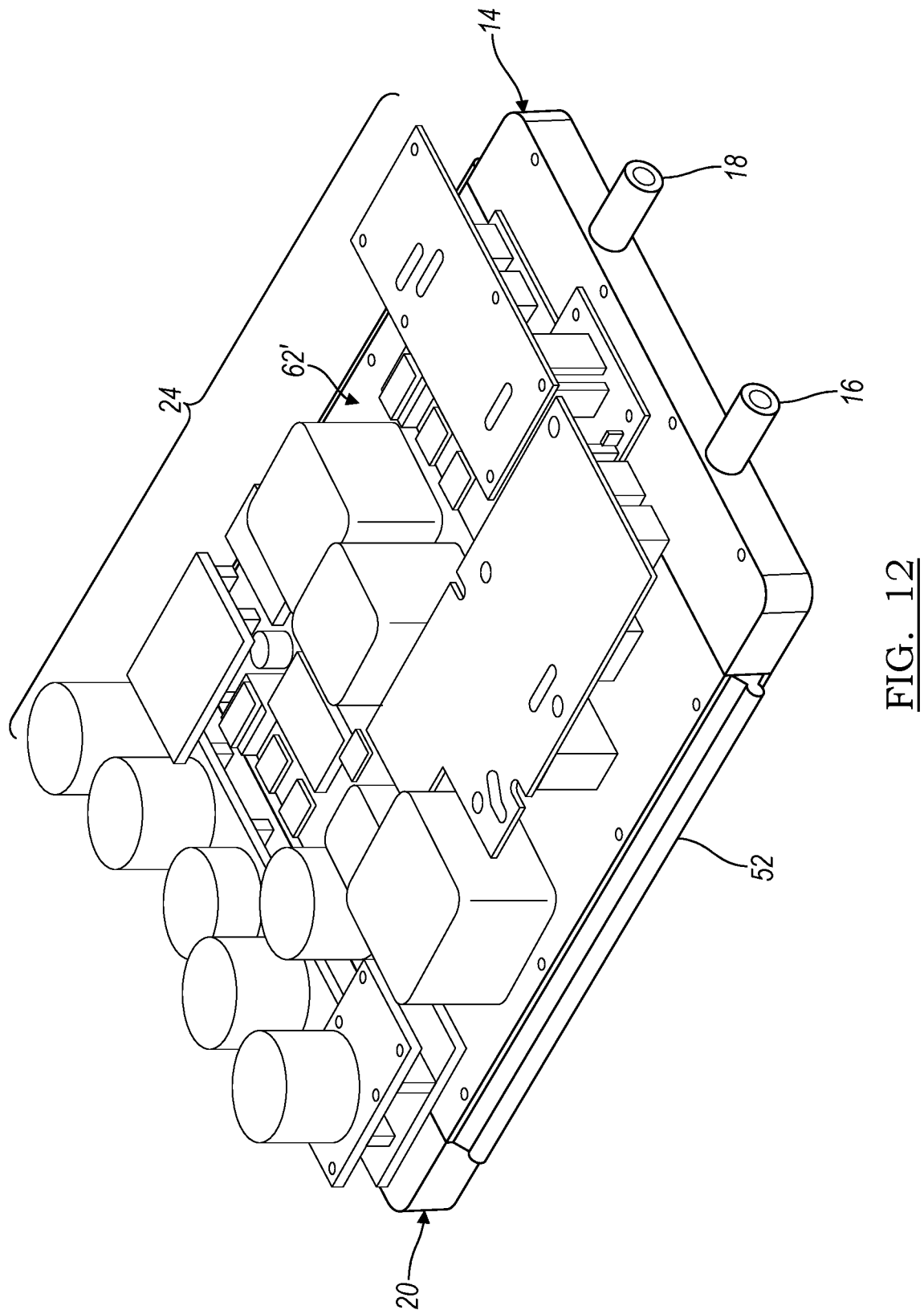
FIG. 12 is a perspective view depicting another implementation of a portion of an auxiliary-cooled electronics assembly.
Figure 13:
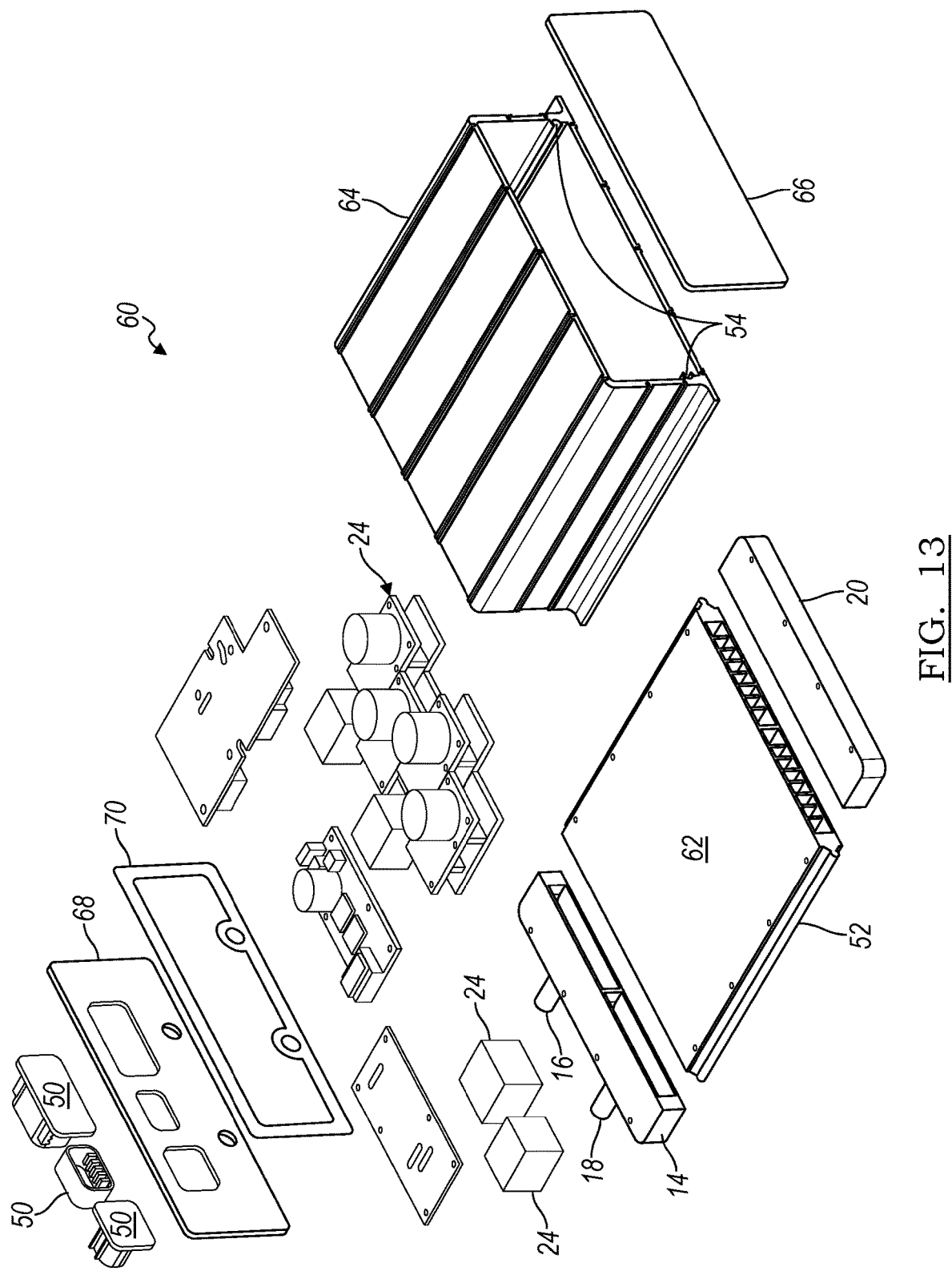
FIG. 13 is an exploded view depicting another implementation of an auxiliary-cooled electronics assembly.

FIG. 8 depicts an implementation of the metal extrusion 62 included with the assembly. The overall structure of the metal extrusion 62 and the cooling conduits 26 can be formed by extruding metal through a die as is described above. In some implementations, cooling fins 30 can be formed in the metal extrusion 62 that extend into the cooling conduit(s) 26. The cooling fins 30 can have a cross-section that is defined by the die through which the metal is extruded. The first end cap 14 and the second end cap 20 can be attached to the metal extrusion 62 in a fluid-tight manner to enclose and partially define the cooling conduit(s) 26. The first end cap 14 can be attached to a first end 32 of the metal extrusion 62 so as to close off the first open end 34 and define at least a portion of the fluid conduit(s) 26. The second end cap 20 can be attached to a second end 38 of the metal extrusion 62 so as to close off the second open end 38 define at least a portion of the fluid conduit(s 26). The first end cap 14 and the second end cap 20 can be attached to the metal extrusion 62 in a variety of ways that have been describe above. In this implementation, the metal extrusion 62 includes two fluid conduits 26a, 26b. And the first end cap 14 includes a conduit divider 40 that separates a first fluid conduit 26a from a second fluid conduit 26b. The first end cap 14 can include a fluid inlet 16 that is in fluid communication with the first fluid conduit 26a and a fluid outlet 18 that is in fluid communication with the second fluid conduit 26b. The fluid inlet 16 can be separated from the fluid outlet 18 by the conduit divider 40. The width and height of the first end cap 14 and second end cap 20 can closely conform or match with the width and height of the metal extrusion 62.

One or more electrical circuit components 24 can attach to the metal extrusion 62. An outer surface of the metal extrusion 62 can include a mounting base 28 on which the electrical circuit components 24 can attach to the assembly 60. The mounting base 28 can be a portion of the metal extrusion 62 that, on one side, receives the electrical circuit components 24, and on another opposite side of the mounting base 28 exists a cooling conduit that carries cooling fluid. The metal cover extrusion 64 can be formed using techniques similar to those described above. A metal blank can be forced through a die that is shaped as a cross-section of the cover extrusion 64. The length of the metal cover extrusion 64 can be defined by the size of the metal blank or it can be cut to a particular size. In one implementation, the metal extrusion 62 can be combined with the metal cover extrusion 64 so that a cavity formed in the hollow cross-section receives the metal extrusion. Receiving grooves 54 for receiving the mounting flanges 52 or other corresponding protuberances existing on the metal extrusion 62 can be formed during the process of extruding the metal cover extrusion 64. The receiving grooves 54 can be slots that extend axially along the length of the cover extrusion 64 between which the flanges 52 fit as the metal extrusion 62 is slid within the metal cover extrusion 64 during assembly. Cover end caps 66, 68 can attach to open ends of the metal cover extrusion and may prevent the axial movement of the metal extrusion 62 relative to the metal cover extrusion. A gasket 70 may be used between at least one of the cover end caps 66, 68 and the cover extrusion 64.

Turning to FIGS. 14-15, another implementation of an auxiliary-cooled electronics assembly 80 is shown. The assembly 80 includes a metal extrusion 82 having a cooling conduit 84 extending axially along a length of the metal extrusion 82. The fluid conduit 84 includes a first open end 34 and a second open end 38. A cover conduit 86 extends axially along the length of the metal extrusion 82 and is separated from the cooling conduit 84 by a mounting base 86 extending in between the cover conduit 86 and the cooling conduits. In this implementation, the metal extrusion 82 includes both a cooling conduit 84 as well as a cover at least partially defined by the cover conduit 86, a portion of which can be formed as a unitary piece from an extruded piece of metal. The cooling conduit 84 may include a plurality of cooling fins 30. Both the cooling conduit 84 and the cover conduit 86 can be at least partially closed by a first end cap 90 coupled to a first end 32 of the metal extrusion 82 forming a fluid-tight seal between the first end cap 90 and the first open end 34; the first end cap 90 can also close off one end of the cover conduit 86. A second end cap 92 coupled to a second end 36 of the metal extrusion 82 can form a fluid-tight seal between the second end cap 92, and the second open end 38; the second end cap 92 can also close off another end of the cover conduit 86. The first end cap 90 and the second end cap 92 can be attached to the metal extrusion 82 using metal fasteners, such as bolts received by threaded sockets 94 in the extrusion 82, that compress the first end cap 90 and the second end cap 92 against the metal extrusion 82. The first end cap 90 can include a fluid inlet 16 for receiving cooling fluid that flows through the cooling conduit 84. The second end cap 92 can include a fluid outlet 18 for cooling fluid leaving the cooling conduit 84. However, other implementations are possible in which one of the first end cap 90 or the second end cap 92 can include both the fluid inlet 16 and the fluid outlet 18. In some implementations, the first/second end caps 90, 92 can compress a sealing gasket (not shown) in between the caps 90, 92 and the metal extrusion 82. One or more electrical circuit components 24, electrically linked together to form an electrical circuit, can be mounted to the metal extrusion 82. In this implementation, the electrical circuit components 24 can be affixed to the mounting base 28 as is described above.

It is to be understood that the foregoing is a description of one or more embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "e.g.," "for example," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

What is claimed is:

1. An auxiliary-cooled electronics assembly, comprising:
    a metal extrusion including:
        one or more cooling conduits extending axially along a length of the metal extrusion, including:
            a first open end in fluid communication with the cooling conduit(s);
            a second open end in fluid communication with the cooling conduit(s);
            a first end cap coupled to the first open end forming a fluid-tight seal between the first end cap and the metal extrusion;
            a second end cap coupled to the second open end forming a fluid-tight seal between the second end cap and the metal extrusion; and
        one or more electrical circuit components, electrically linked together to form an electrical circuit, wherein the electrical circuit components are mounted to an exterior surface of the metal extrusion.

2. The auxiliary-cooled electronics assembly recited in claim 1, wherein the first end cap is coupled to the first open end and the second end cap is coupled to the second open end with welds.

3. The auxiliary-cooled electronics assembly recited in claim 1, wherein the first end cap is coupled to the first open end and the second end cap is coupled to the second open end with one or more mechanical fasteners.

4. The auxiliary-cooled electronics assembly recited in claim 1, further comprising a cover, attached to the metal extrusion, encapsulating the electrical circuit components between the metal extrusion and the cover.

5. The auxiliary-cooled electronics assembly recited in claim 4, wherein the cover further comprises a metal cover extrusion, having a hollow cross-section that receives the electrical circuit components.

6. The auxiliary-cooled electronics assembly recited in claim 4, wherein the cover includes electromagnetic shielding.

7. The auxiliary-cooled electronics assembly recited in claim 4, wherein the cover is molded from a composite material.

8. The auxiliary-cooled electronics assembly recited in claim 1, wherein the first end cap includes a fluid inlet, a fluid outlet, or both a fluid inlet and a fluid outlet.

9. The auxiliary-cooled electronics assembly recited in claim 1, wherein the second end cap includes a fluid inlet, a fluid outlet, or both a fluid inlet and a fluid outlet.

10. An auxiliary-cooled electronics assembly, comprising:
    a metal extrusion including:
        one or more cooling conduits extending axially along a length of the metal extrusion, including:
            a first open end in fluid communication with the cooling conduit(s);
            a second open end in fluid communication with the cooling conduit(s);
        a cover conduit, extending axially along the length of the metal extrusion, separated from the cooling conduit(s) by a mounting base extending in between the cover conduit and the cooling conduit(s);
        a first end cap coupled to a first end of the metal extrusion forming a fluid-tight seal between the first end cap and the first open end;
        a second end cap coupled to a second end of the metal extrusion forming a fluid-tight seal between the second end cap and the second open end; and
    one or more electrical circuit components, electrically linked together to form an electrical circuit, mounted to the metal extrusion.

11. The auxiliary-cooled electronics assembly recited in claim 10, wherein the first end cap covers a first cover conduit end and the second end cap covers a second cover conduit end, thereby enclosing the electrical circuit component(s) within the metal extrusion.

12. The auxiliary-cooled electronics assembly recited in claim 10, wherein the electrical circuit components are mounted directly to the mounting base.

13. The auxiliary-cooled electronics assembly recited in claim 10, wherein the first end cap is coupled to the first end of the metal extrusion and the second end cap is coupled to the second end of the metal extrusion with welds.

14. The auxiliary-cooled electronics assembly recited in claim 10, wherein the first end cap is coupled to the first end of the metal extrusion and the second end cap is coupled to the second end of the metal extrusion with one or more mechanical fasteners.

15. The auxiliary-cooled electronics assembly recited in claim 10, wherein the metal extrusion includes electromagnetic shielding.

16. An auxiliary-cooled electronics assembly, comprising:
    a metal extrusion including:
        one or more cooling conduits extending axially along a length of the metal extrusion, including:
            a first open end in fluid communication with the cooling conduit(s);
            a second open end in fluid communication with the cooling conduit(s);
        a first end cap coupled to a first end of the metal extrusion forming a fluid-tight seal between the first end cap and the first open end;
        a second end cap coupled to a second end of the metal extrusion forming a fluid-tight seal between the second end cap and the second open end;
    a metal cover extrusion, including a cover conduit, that couples with the metal extrusion; and
    one or more electrical circuit components, electrically linked together to form an electrical circuit, mounted to the metal extrusion within the cover conduit.

17. The auxiliary-cooled electronics assembly recited in claim 16, wherein the metal extrusion is received within the cover conduit of the metal cover extrusion.

18. The auxiliary-cooled electronics assembly recited in claim 17, further comprising a first metal cover extrusion cap and a second metal cover extrusion cap.

* * * * *